United States Patent [19]

Yasuda et al.

[11] Patent Number: 5,399,872
[45] Date of Patent: Mar. 21, 1995

[54] CHARGED-PARTICLE BEAM EXPOSURE METHOD

[75] Inventors: Hiroshi Yasuda; Junichi Kai; Hisayasu Nishino; Soichiro Arai; Yoshihisa Oae, all of Kawasaki, Japan

[73] Assignee: Fujitsu Limited, Kawasaki, Japan

[21] Appl. No.: 138,219

[22] Filed: Oct. 20, 1993

[30] Foreign Application Priority Data

Oct. 20, 1992 [JP] Japan .................................. 4-281877

[51] Int. Cl.$^6$ ........................................... H01J 37/302
[52] U.S. Cl. .................................. 250/492.22; 250/398
[58] Field of Search ............ 250/492.22, 398, 492.2 R

[56] References Cited

U.S. PATENT DOCUMENTS 5,144,142  9/1992  Fueki et al. .................... 250/492.22

Primary Examiner—Paul M. Dzierzynski
Assistant Examiner—Kiet T. Nguyen
Attorney, Agent, or Firm—Staas & Halsey

[57] ABSTRACT

A charged-particle beam exposure method is used for a charged-particle beam exposure apparatus equipped with a blanking aperture array plate in which columns are arranged side by side in a first direction, and each of the columns includes a plurality of blanking apertures arranged in a second direction substantially perpendicular to the first direction, a charged-particle beam being moved on a wafer in the first direction. The method includes the steps of (a) determining one of first and second axes of a pattern to be exposed to be a priority axis; (b) projecting an image of the blanking aperture array plate onto the wafer so that the priority axis is perpendicular to the second direction; and (c) deflecting the charged-particle beam so that the wafer is scanned in the direction of the priority axis.

7 Claims, 13 Drawing Sheets

CHARGED-PARTICLE BEAM EXPOSURE METHOD

BACKGROUND OF THE INVENTION

1. Field of the Invention

The present invention generally relates to charged-particle beam exposure methods using charged-particle beam exposure apparatuses and, more particularly, to a charged-particle beam exposure method using a charged-particle beam exposure apparatus equipped with a blanking aperture array plate (hereinafter referred to as a BAA plate) in which a plurality of blanking apertures are arranged two-dimensionally in an array.

2. Description of the Prior Art

Recently, the integration density and function of integrated circuits have been improved and use of such integrated circuits is expected to be a core technique in the progress of computers, communications, and mechanical control so on.

The density of integrated circuits has been increased four times every two or three years. For example, the integration density of DRAMs has been increased to 1M, 4M, 16M, 64M, 256M and 1 G. Such an improvement in the integration density is mainly based on the progress of a fine (i.e., processor) production technique, such as a lithography technique.

A current electron beam exposure apparatus that is a lithography apparatus is capable of performing a fine production at a pitch equal to or less than 0.05 $\mu$m with a precision of 0.02 $\mu$m or less. However, it is generally said that the throughput of such an electron beam exposure apparatus is low and unsuitable for mass production of LSIs.

However, strictly speaking, the above holds true for electron beam exposure apparatuses of a single-stroke exposure type, such as a point-beam type electron beam exposure apparatus or a variable rectangular beam type electron beam exposure apparatus. Further, in actuality, such electron beam exposure apparatuses have not been sufficiently considered from the physical and technical viewpoints, particularly concerning what causes the low throughput. In other words, the above disadvantage of low throughput is based on the fact that the throughput of the electron beam exposure apparatuses available on the market is actually low.

Recently, a throughput approximately equal to 1 $cm^2$/sec has been expected by the proposal of an electron beam exposure apparatus equipped with a block mask (stencil mask) or a BAA plate. The above proposed apparatus is superior to the other lithography apparatuses from many viewpoints, such as precision of formable patterns, positioning and quick turnaround, and reliability. Particularly, an electron beam exposure apparatus equipped with a BAA plate is very attractive because such an apparatus is capable of exposing a random pattern formed on a wafer at high speed, while such a random pattern cannot be efficiently formed by an electron beam exposure apparatus equipped with a block mask.

Nowadays, there has been considerable activity in the development of an electron beam exposure apparatus equipped with a BAA plate. The present invention is intended to provide an improvement in the formation of patterns.

SUMMARY OF THE INVENTION

It is an object of the present invention to provide a charged-particle beam exposure apparatus equipped with a BAA plate in which edges of a pattern, of a high degree of importance or criticality, can be formed with a high precision.

The above object of the present invention is achieved by a charged-particle beam exposure method using a charged-particle beam exposure apparatus equipped with a blanking aperture array plate in which columns are arranged side by side in a first direction, and each of the columns includes a plurality of blanking apertures arranged in a second direction substantially perpendicular to the first direction, a charged-particle beam being moved on a wafer in the first direction, said charged-particle beam exposure method comprising the steps of:
  (a) determining one of first and second axes of a pattern to be exposed to be a priority axis;
  (b) projecting an image of the blanking aperture array plate onto the wafer so that the priority axis is perpendicular to the second direction; and
  (c) deflecting the charged-particle beam so that the wafer is scanned in the direction of the priority axis.

BRIEF DESCRIPTION OF THE DRAWINGS

Other objects, features and advantages of the present invention will become more apparent from the following detailed description when read in conjunction with the accompanying drawings, in which.

DESCRIPTION OF THE PREFERRED EMBODIMENTS

A description will now be given of an electron beam exposure apparatus equipped with a BAA plate.

Figure 1:
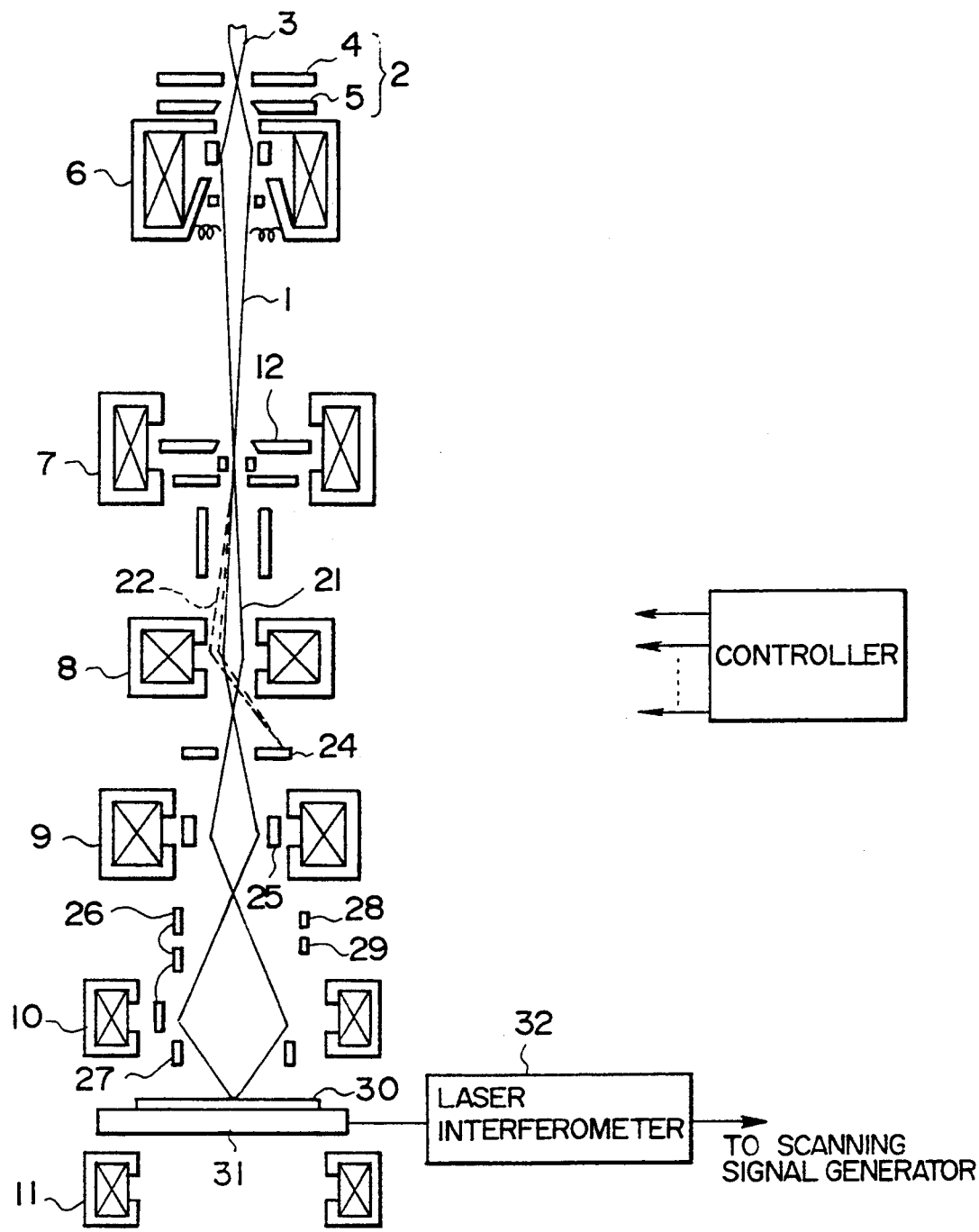
FIG. 1 is a diagram of an electron beam exposure apparatus equipped with a BAA plate.

Referring to FIG. 1, an electron beam exposure apparatus equipped with a BAA plate includes an electron gun 2 emitting an electron beam 1, the electron gun 2 includes including a cathode 3, a grid 4 and an anode 5. Electromagnetic lenses 6–11 converge the electron beam due to the function of the magnetic field formed thereby. A BAA plate 12 is provided on the downstream side of the electromagnetic lens 6.

Figure 2:
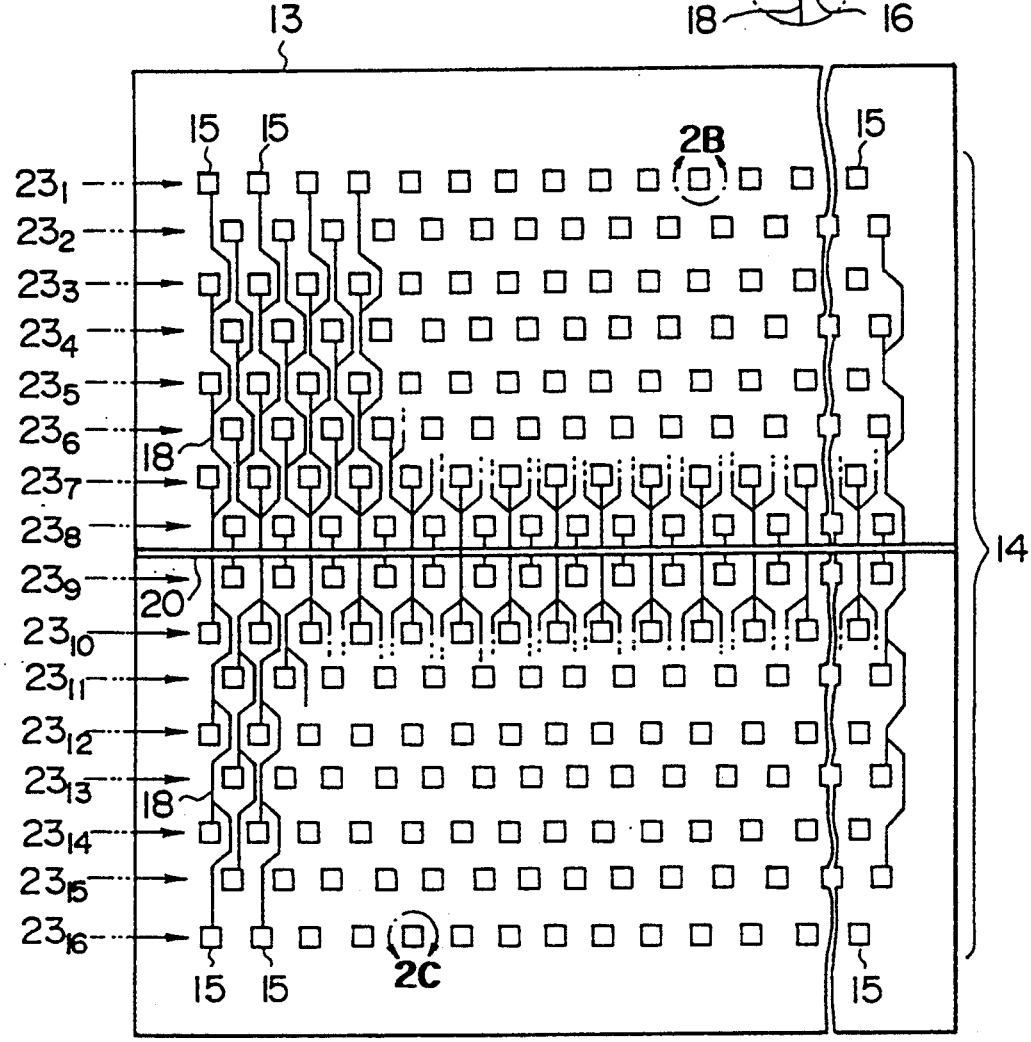
FIG. 2A is a plan view of the BAA plate shown in FIG. 1 and FIGS. 2B and 2C are enlarged views of two, respective blanking apertures.

FIG. 2 is a plan view of the BAA plate 12. As shown in FIG. 2, the BAA plate 12 includes a base plate 13, a BAA area 14 and blanking apertures 15 which are arranged in the BAA area 14. Each of the blanking apertures 15 has a rectangular shape, and is equipped with blanking electrodes 16 and 17 opposite to each other as shown in the enlarged views of FIGS. 2B and 2C for the illustrative, specific apertures 15' and 15". A ground line 18 is connected to the electrode 16, and a signal line 19 is connected to the electrode 17. The ground lines 18 extending from the blanking apertures 15 are electrically connected to a common ground line 20. The signal lines 19 connected to the electrodes 17 are connected to an ON/OFF signal generator (not shown) of a controller CNTRL.

The BAA plate 12 can produce electron beams respectively associated with the blanking apertures 15 align the two columns with each other, in a pair on the upstream side thereof. In this case, the electron beams passing through the blanking apertures, for which the respective blanking electrodes 15 are supplied with an ON signal via the signal lines 17 are not deflected and are projected onto a wafer 30. Such electron beams are referred to as ON beams and are indicated, as a whole (i.e., group) by a reference number 21 in FIG. 1. The electron beams passing through the blanking apertures for which the respective blanking electrodes 17 are supplied with an OFF signal via the signal lines 17 are deflected and are not projected on the wafer 30. Such electron beams are referred to as OFF beams and are indicated, as a whole (i.e., group), by reference number 22 in FIG. 1.

Figure 16:
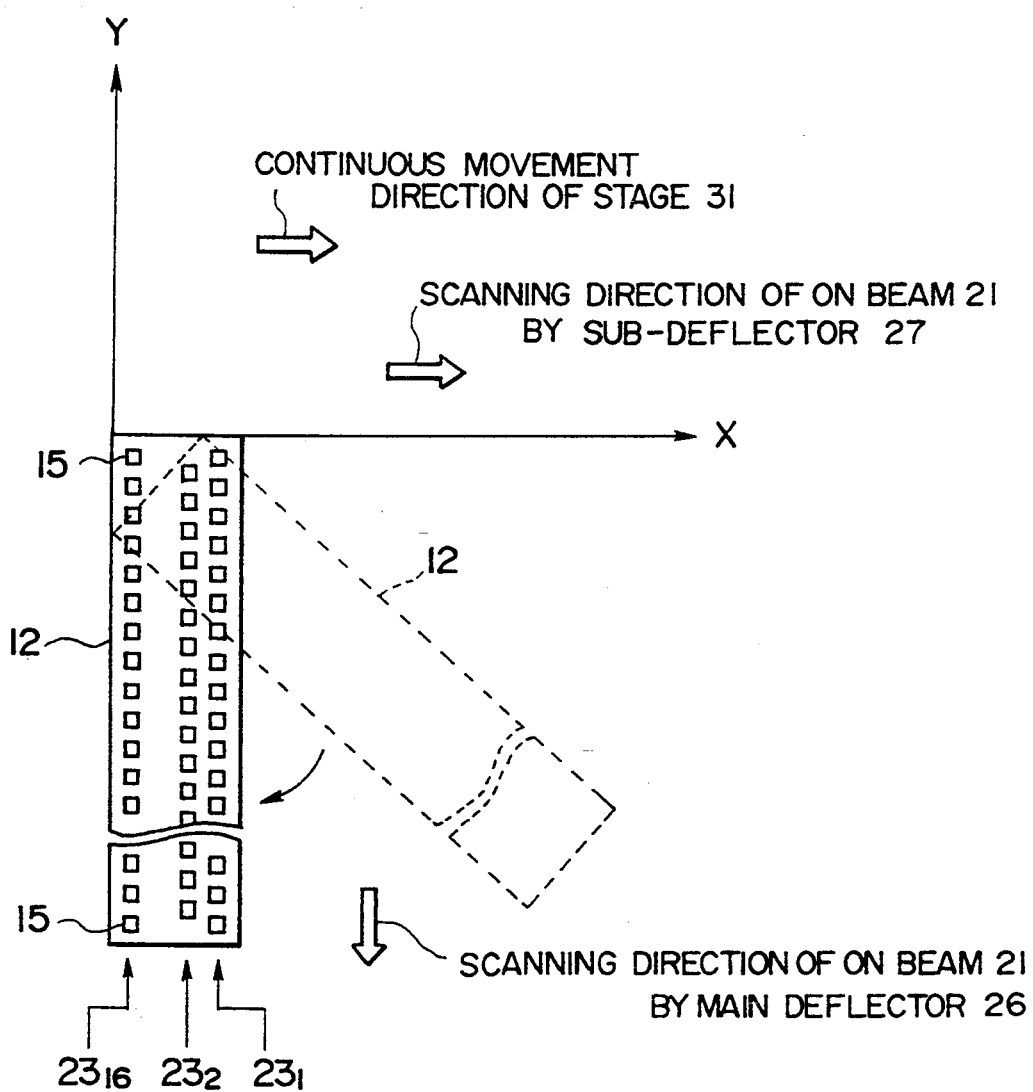
FIG. 16 is a diagram showing the position of the magnetic projection of the BAA plate selected when an X axis is selected as the priority axis according to the embodiment of the present invention.

In the structure shown in FIG. 2A, 16 columns $23_1$, $23_2$, ..., $23_{16}$ of each plane blanking apertures 15 are formed on the base plate 16 in parallel with each other. An identical number of blanking apertures 15 is arranged at the same or almost the same intervals in each of the 16 columns $23_1$, $23_2$, ..., $23_{16}$. Further, in the structure shown in FIG. 2, the arrangement phases of the respective blanking apertures 15 in the blanking aperture columns $23_1$, $23_3$, $23_5$, $23_7$, $23_{10}$, $23_{12}$, $23_{14}$ and $23_{16}$ are the same as each other. Further, the arrangement phases of the respective blanking apertures 15 in the blanking aperture columns $23_2$, $23_4$, $23_6$, $23_8$, $23_9$, $23_{11}$, $23_{13}$ and $23_{15}$ are the same as each other. The arrangement phases of the respective blanking apertures 15 in the blanking aperture columns $23_2$, $23_4$, $23_6$, $23_8$, $23_9$, $23_{11}$, $23_{13}$ and $23_{15}$ are $\frac{1}{2}$ shifted relative to the arrangement phases of the respective blanking apertures 15 in the blanking aperture columns $23_1$, $23_3$, $23_5$, $23_7$, $23_{10}$, $23_{12}$, $23_{14}$ and $23_{16}$.

When exposing the wafer 30, pairs of blanking aperture columns $23_1$ and $23_2$, $23_3$ and $23_4$, ..., $23_{15}$ and $23_{16}$ are controlled so as to effectively align the two columns in a pair with each other. More particularly, the OFF signal is applied to the blanking aperture columns $23_{2k-1}$ (K=1–8) with a timing different from that with which the OFF signal is applied to the blanking aperture columns $23_{2k}$. Further, the ON beams 21 from the blanking aperture columns $23_{2k-1}$ and the ON beams 21 from the blanking aperture columns $23_{2k}$ are controlled so as to be projected on a common exposure column on the wafer 30.

Further, the electron beams exposure apparatus shown in FIG. 1 includes an aperture 24 for blanking, a refocusing coil 25 for correcting a positional deviation of the focal point, a main deflector 26 for deflecting the ON beams 21 for each sub-field, and a sub-deflector 27 for deflecting the ON beams 21 within each sub-field. Further, the apparatus shown in FIG. 1 includes a dynamic focusing coil 28 for correcting the focal point on the basis of the positions to which the ON beams 21 are deflected, and a dynamic stig coil 29 for correcting aberrations of the ON beams projected onto the wafer 30.

A stage 31 supports the wafer 30 and a laser interferometer 32 detects the position of the stage 31. A position detection signal output by the laser interferometer 32 is a scanning signal generator (not shown) of the controller CNTRL, the generator generating scanning signals to be applied to the main deflector 26 and the sub-deflector 27.

Figure 3:
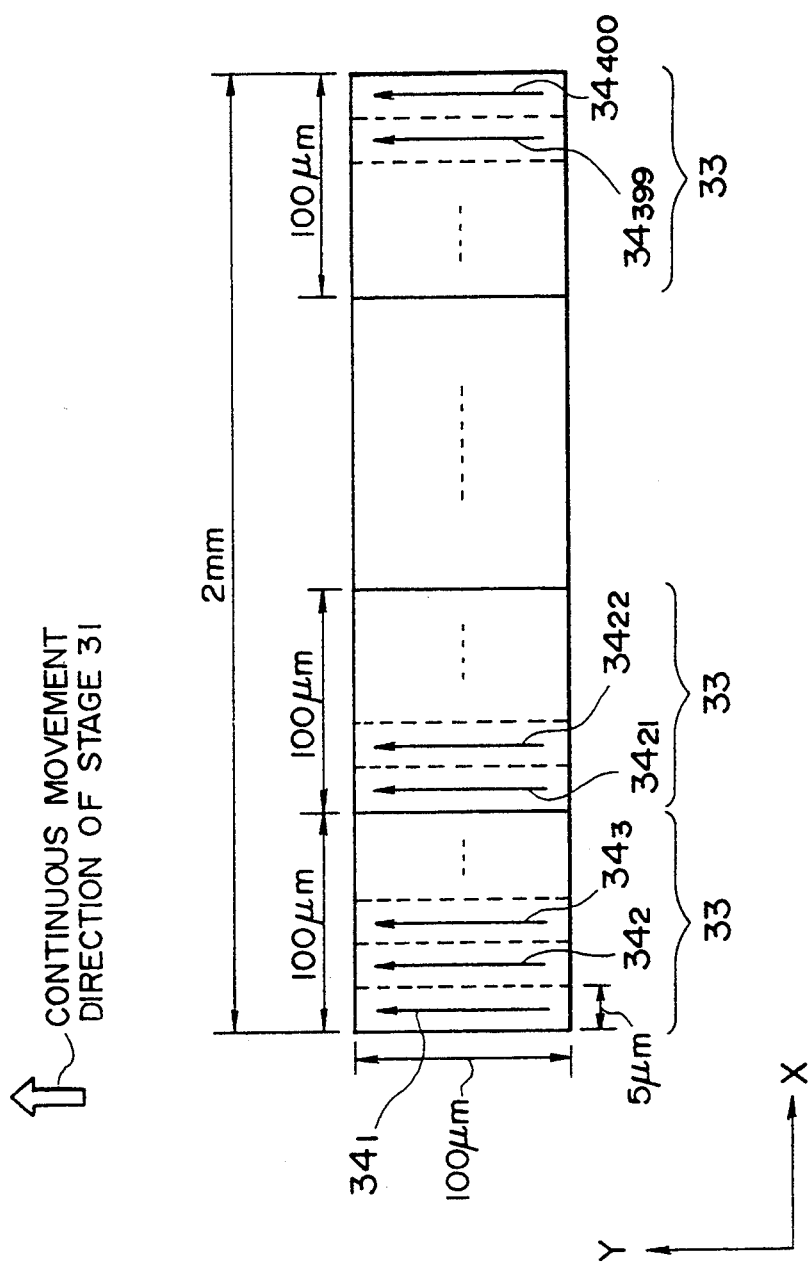
FIG. 3 is a diagram showing a conventional ON beam scanning direction and a continuous movement direction of a stage.

FIG. 3 shows a conventional ON-beam scanning direction, and a conventional direction in which the stage 31 is continuously moved. An X axis and a Y axis function as reference axes to be referred to when a pattern is formed. Reference numbers 33 indicate subfields.

In a conventional exposure method, the ON beam scan is carried out for each layer to be formed on the wafer 30 in the following manner. The continuous movement direction of the stage 31 coincides with the Y-axis direction. A rectangular unit area is defined in which the long edge of the rectangular unit area is equal to 2 mm and the short edge thereof is equal to 100 μm. The ON beam is sequentially moved along strips of width 5 μm in the direction of the arrows, proceeding from the left side to the right of each unit in the sequence $34_1$, $34_2$, ..., $34_{400}$.

Figure 4:
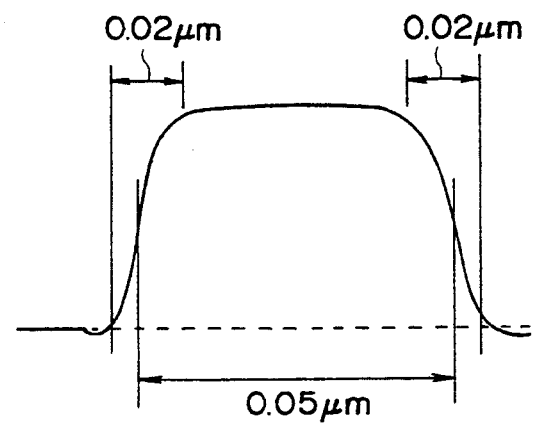
FIG. 4 is a diagram of an energy profile of the ON beam.
Figure 5:
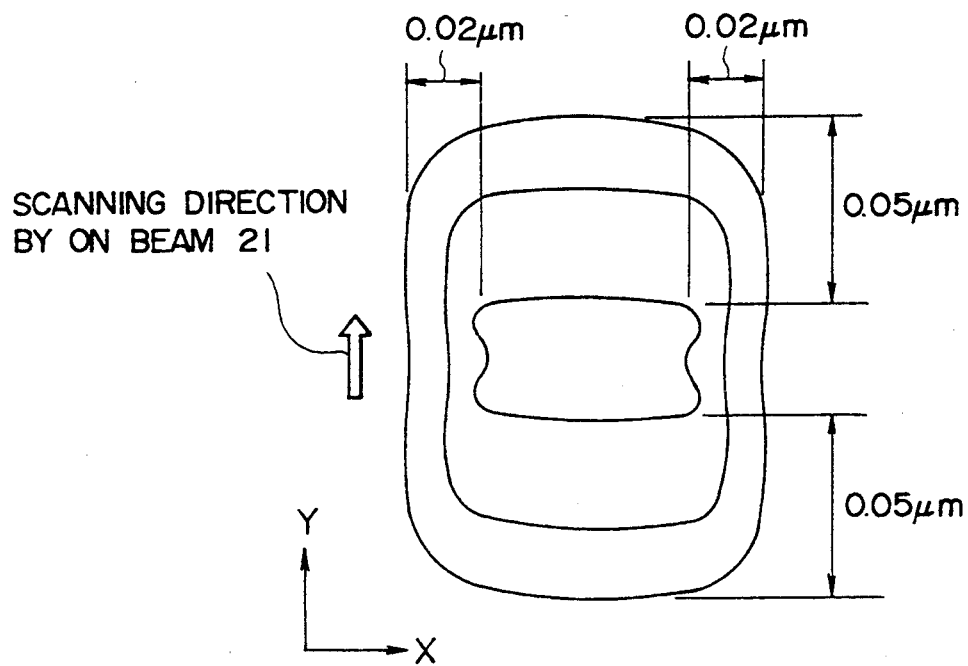
FIG. 5 is a diagram of a pattern formed on a wafer.

The ON beam 21 is formed into 0.05 μm□ and the OFF beam 21 is also formed into 0.05 μm□. The sharpness of the energy profile of the ON beam 21 projected onto the wafer 30 is equal to 0.02 μm, as shown in FIG. 4. When the ON beam 21 is continuously moved, the fade-out edge of a pattern extending in the scanning direction of the ON beam 21 approximately coincides with the sharpness of the energy profile of the ON beam 21, and is equal to 0.02 μm, as shown in FIG. 5. On the other hand, the ON beam 21 is scanned at a rate of 2.5 nsec/0.05 μm (400 MHz), and hence the fade-out edge of the pattern in the direction perpendicular to the scanning direction of the ON beam 21 is 0.05 μm, which degrades the degree of resolution.

Figure 6:
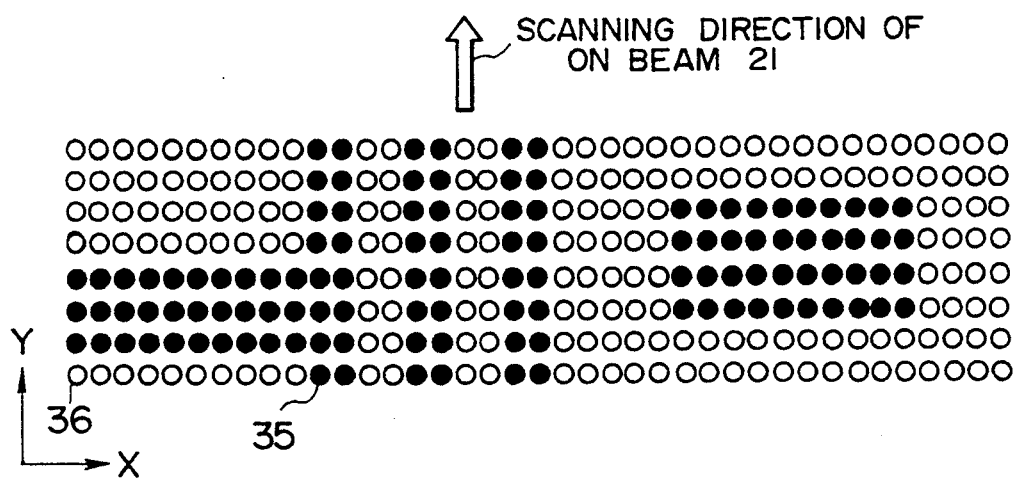
FIG. 6 is a diagram schematically illustrating dots formed on the wafer.
Figure 7:
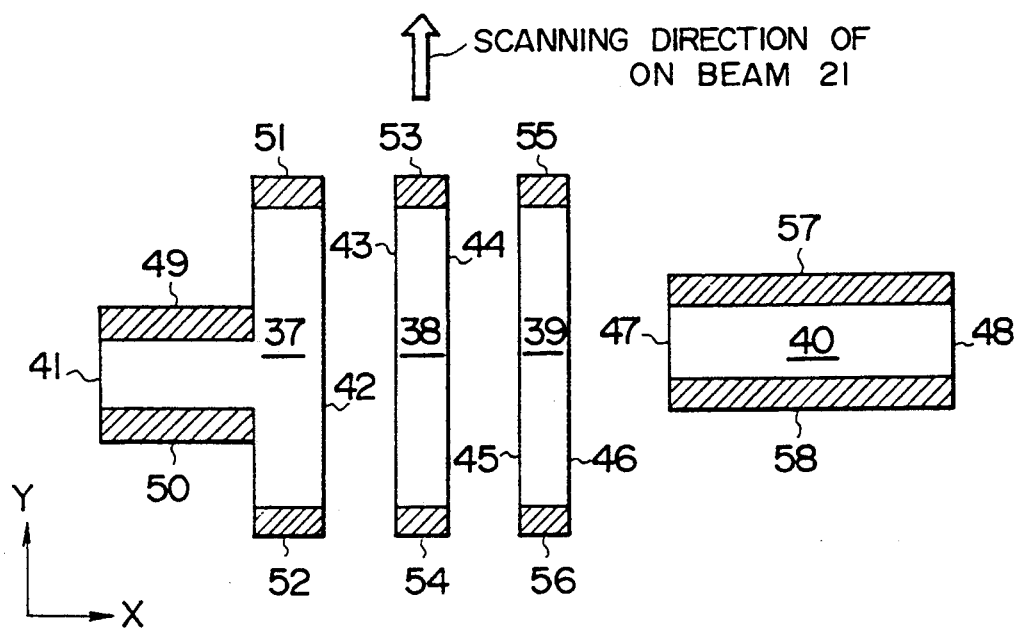
FIG. 7 is a diagram of patterns formed on the wafer.

FIGS. 6 and 7 show the above-mentioned scanning process in more detail. More particularly, FIG. 6 schematically illustrates dots on the surface of the wafer 30. Black circles 35 denote dots projected by the ON beam 21, and white circles 36 denote dots where the On beam 21 has not been projected. FIG. 7 shows patterns formed on the surface of the wafer 20.

When the surface of the wafer 30 is exposed as shown in FIG. 6 to thereby form patterns 37–40 shown in FIG. 7, edges 41–48 extending in the scanning direction of the ON beam 21 are sharp, without a great degree of fade-out, while edges 49–58 have great fade-out areas as shown by hatched areas in FIG. 7.

Figure 8:
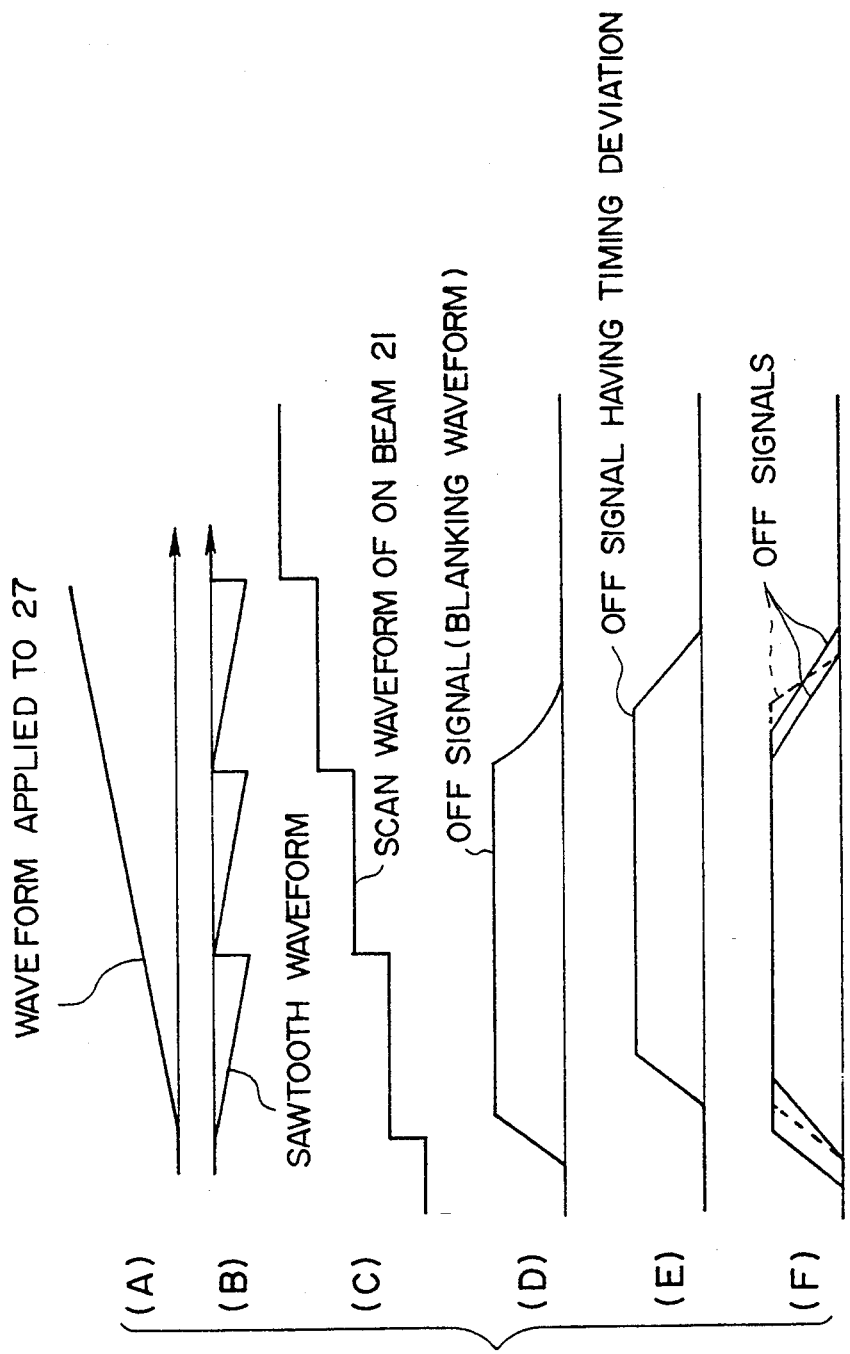
FIG. 8 is a waveform diagrams of signals applied to the electron beam exposure apparatus shown in FIG. 1.

It will now be assumed that a scan waveform shown in part (A) of FIG. 8 is applied to the sub-deflector 27, that a high-speed deflector enabling a small deflection is provided and that a sawtooth waveform of a frequency of 400 MHz shown in part (B) of FIG. 8 is applied to the above high-speed deflector. In this case, a resist on the wafer 30 can be exposed for each dot at intervals of 0.05 μm by the ON beam 21 having a scan waveform shown in part (C) of FIG. 8. Hence, the resolution of pattern edges extending in the direction perpendicular to the scanning direction of the ON beam 21 can be improved.

However, even in the above case, the ON beam 21 fades gradually on or off due to dull leading and trailing edges of the OFF signal (blanking waveform) applied to the blanking electrodes 17, as shown in part (D) of FIG. 8. If the scanning using the ON beam 21 is carried out stepwise at intervals of 0.05 μm, as shown in part (E) of FIG. 8, the ON beam 21 used to form the previous dot may disappear from the wafer 30 only after the exposure process has shifted to the next dot position or the ON beam 21 used to expose the next dot may appear prematurely in the previous dot position. The above disadvantage arises from a timing difference between the OFF signal and the scan waveforms, as shown in part (E) of FIG. 8.

Further, 128 blanking apertures are operatively arranged in the direction perpendicular to the scanning direction of the ON beam 21, while the waveform of the OFF signal varies as shown in part (F) of FIG. 8.

Figure 9:
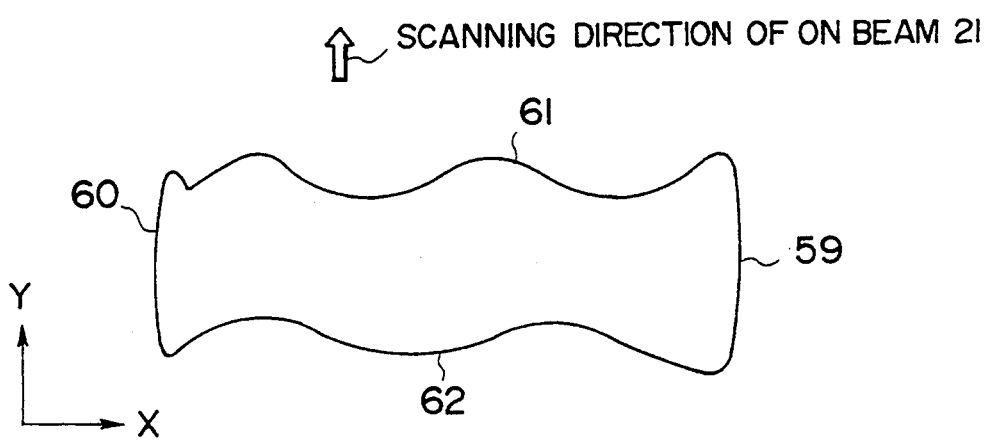
FIG. 9 is a diagram of a pattern formed on the wafer.

For the above-mentioned reasons, as shown in FIG. 9, pattern edges 59 and 60 extending in the scanning direction of the ON beam 21 can be finely formed without fade-out and wavy portions (fluctuations), while pattern edges 61 and 62 extending in the direction perpendicular to the scanning direction of the ON beam 21 have fade-out portions and wavy portions even when using the sawtooth waveform shown in part (B) of FIG. 8.

The following are values for (1) the sharpness S1 of pattern edges extending in the direction parallel to the scanning direction of the 0N beam 21, (2) the sharpness S2 of pattern edges extending in the direction perpendicular to the scanning direction of the ON beam 21, (3) the minimum pattern width W1 in the direction perpendicular to the scanning direction of the ON beam 21, and (4) the minimum pattern width W2 in the direction parallel to the scanning direction of the ON beam 21:

$S1 = 0.02$ μm
$S2 = 0.03-0.05$ μm
$W1 = 0.05$ μm
$W2 = 0.1$ μm.

As described above, the apparatus with the BAA plate 12 shown in the previously described figures has characteristics in which the sharpness of pattern edges, extending in the direction perpendicular to the scanning direction of the ON beam 21, is poorer than that of pattern edges in the direction parallel to the scanning direction thereof and the minimum pattern width measured in the direction parallel to the scanning direction of the ON beam 21 is greater than that in the scanning direction of the ON beam 21.

However, conventionally, the scanning direction of the ON beam 21 is fixed. Hence, some patterns do not have good precision. In actuality, the exposure apparatus has the above-mentioned characteristics, and pattern exposure must be performed with the above in mind.

Figure 10:
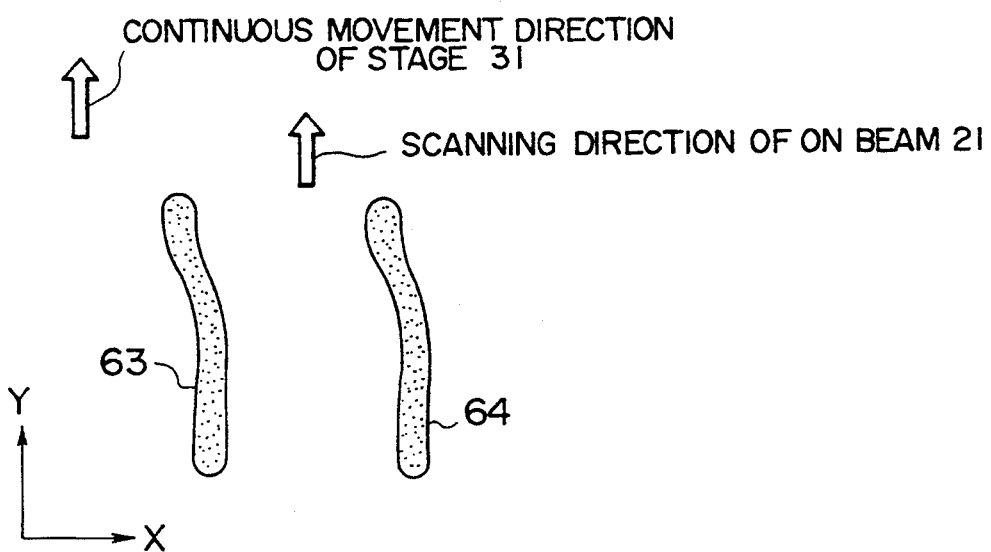
FIG. 10 is a diagram of a pattern formed on the wafer.

A mechanism by which the exposure precision is degraded due to the continuous movement of the stage 31 will now be described. From the physical viewpoint, pattern edges of the direction (Y-axis direction) of movement of the stage 31 are formed by deflecting the ON beam 21 to an identical position and do not contain deflection efficiency of the sub-deflector 27 and rotation errors in the deflecting direction. Hence, for example, as shown in FIG. 10, patterns 63 and 64, extending in the direction in which the stage 31 is continuously moved, are finely formed without great deformation.

Figure 11:
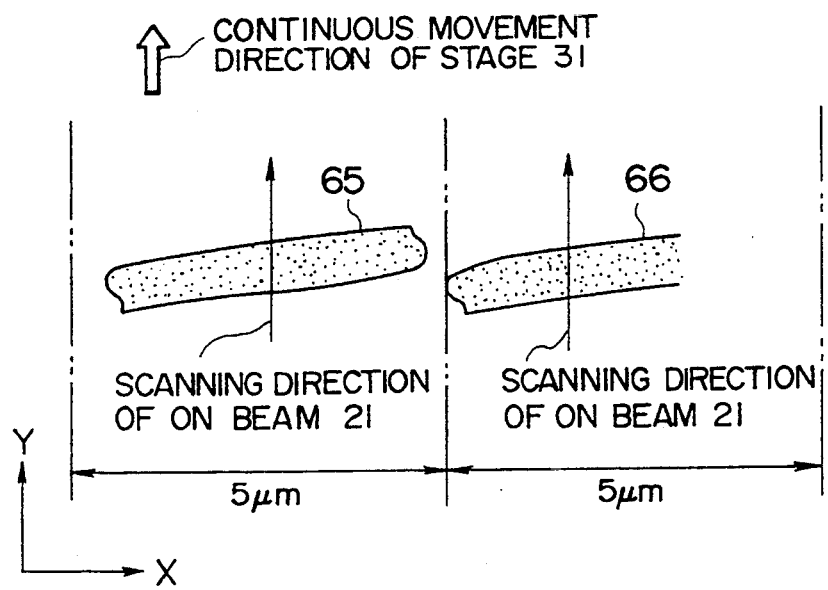
FIG. 11 is a diagram showing a disadvantage encountered in a conventional exposure process.

On the other hand, if a pattern extends in the direction (X-axis direction) perpendicular to the stage movement direction over 5 μm scanning areas, such a pattern must be formed by joining patterns in the X-axis direction. Hence, it is necessary to precisely position, in the Y-axis direction, pattern edges extending in the direction perpendicular to the continuous movement direction of the stage 31. Generally, it is very difficult to join patterns together in the X-axis direction, as shown in FIG. 11, in which patterns 65 and 66 are not joined together correctly.

Figure 12:
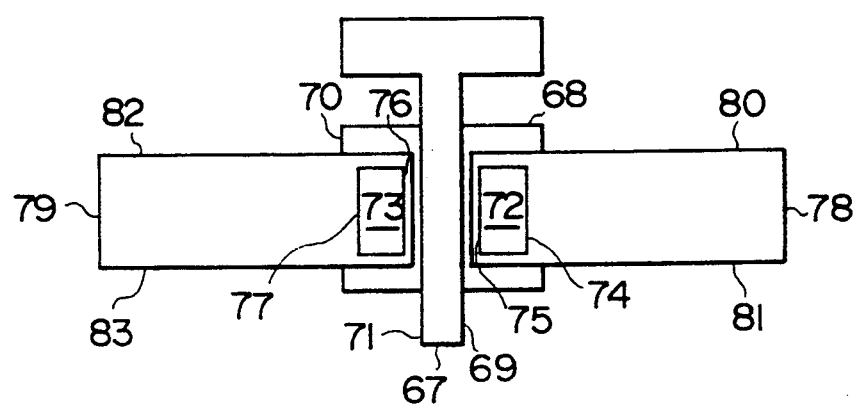
FIG. 12 is a plan view of an LSI pattern.
Figure 13:
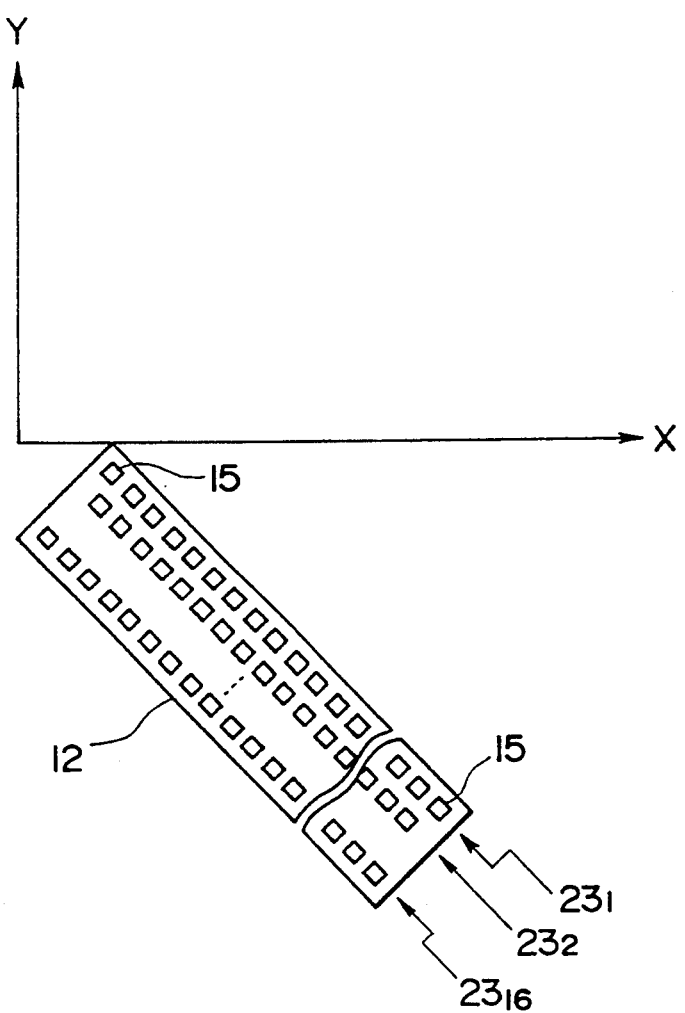
FIG. 13 is a diagram showing an initial state of the apparatus according to an embodiment of the present invention.

The above disadvantage shown in FIG. 11 will cause a problem described below. Referring to FIG. 12 showing a part of an LSI pattern, edges of LSI patterns are very important. For example, a gate 67 must be formed so that an edge 69 of the gate 67 located on the side of a drain 68 and an edge 71 thereof located on the side of a source 70 are finely drawn. Further, regarding contact holes 72 and 73, each having a rectangular shape, long-side edges 74 and 77 thereof must be finely drawn. Furthermore, edges 80–83 of wiring (interconnection) lines 78 and 79 must be finely drawn, these edges 80–83 extending in the direction in which the wiring lines 78 and 79 run. If the wiring lines 78 and 79 are formed at different layer levels (two-layer wiring arrangement), these wiring lines 78 and 79 cross each other.

As described above, there are a plurality of directions on the LSI chip in which the important edges of patterns extend. As the integration density is increased, the above-mentioned problem becomes more severe.

The present invention was made taking into account the above facts found by the inventors. More particularly, the present invention is intended to precisely form pattern edges having a higher degree of importance than the other edges thereof. A description will now be given, with reference to FIGS. 13 through 17, of an electron beam exposure method according to an embodiment of the present invention. The method described below can be performed by the electron beam exposure apparatus shown in FIG. 1. In FIGS. 13 through 17, parts that are the same as those shown in the previously described figures are given the same reference numbers.

In the embodiment of the present invention, either the X axis or the Y axis is previously determined, or selected, to be a priority axis for each of the layers formed on the wafer 30. Information concerning the priority axis obtained for each of the layers is stored, as part of the exposure data, in the controller CNTRL shown in FIG. 1.

The electromagnetic lens 8 located on the downstream side of the BAA plate 12 is controlled so as to form a magnetic field, whereby in the initial state of the electron beam exposure apparatus before exposure, magnetically projected images, in the direction in which the blanking aperture columns $23_1$–$23_{16}$ extend, are inclined at 45° with respect to the X axis and the Y axis.

In the embodiment of the present invention, parameters for exposure are defined as shown in Table 1:

TABLE 1

|  | Priority Axis | |
| --- | --- | --- |
|  | Y axis | X axis |
| D1 | X axis | Y axis |
| D2 | Y axis | X axis |
| D3 | X axis | Y axis |
| D4 | Y axis | X axis | where:
- D1: direction in which blanking aperture columns $23_1$–$23_{16}$ of BAA plate 12 extend
- D2: scanning direction of ON beam 21 by sub-deflector 27
- D3: scanning direction of ON beam by main deflector 26
- D4: continuous movement direction of stage 31

Figure 14:
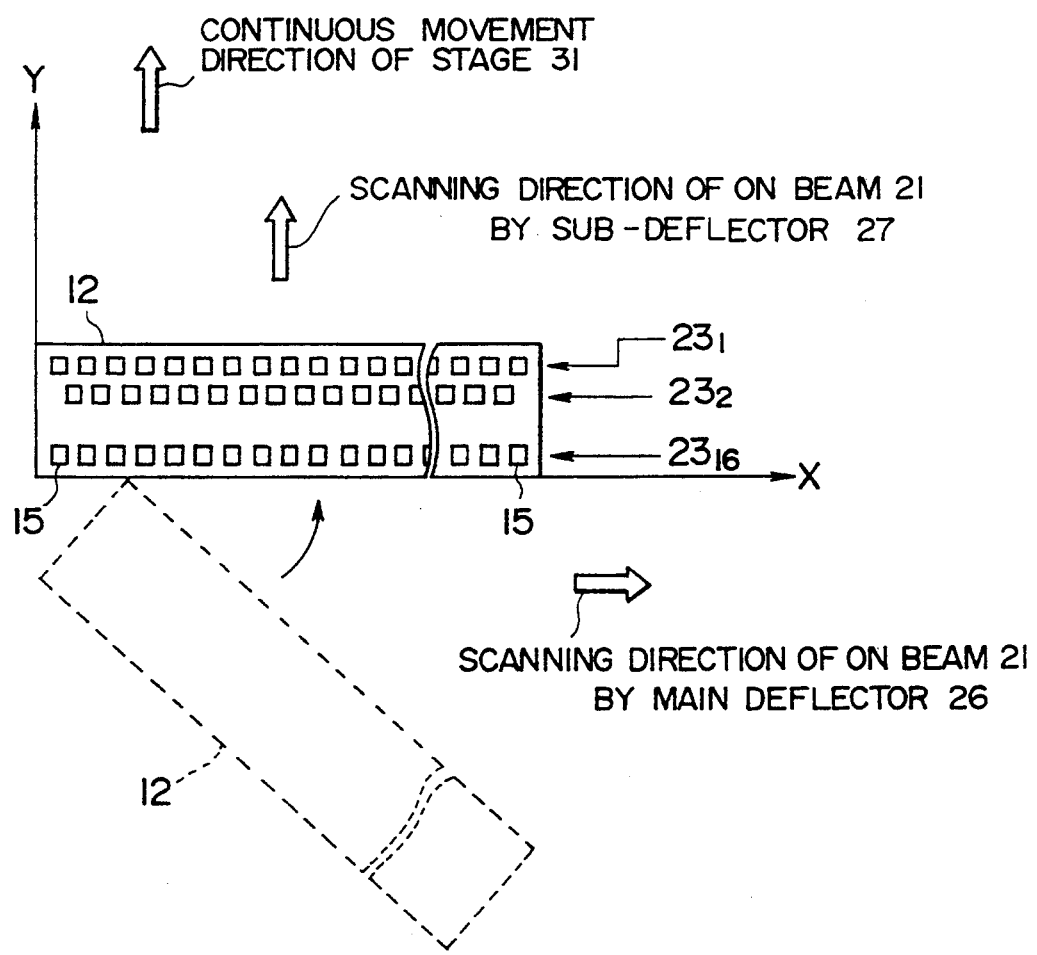
FIG. 14 is a diagram showing the position of a magnetic projection of the BAA plate selected when a Y axis is selected as a priority axis according to the embodiment of the present invention.
Figure 15:
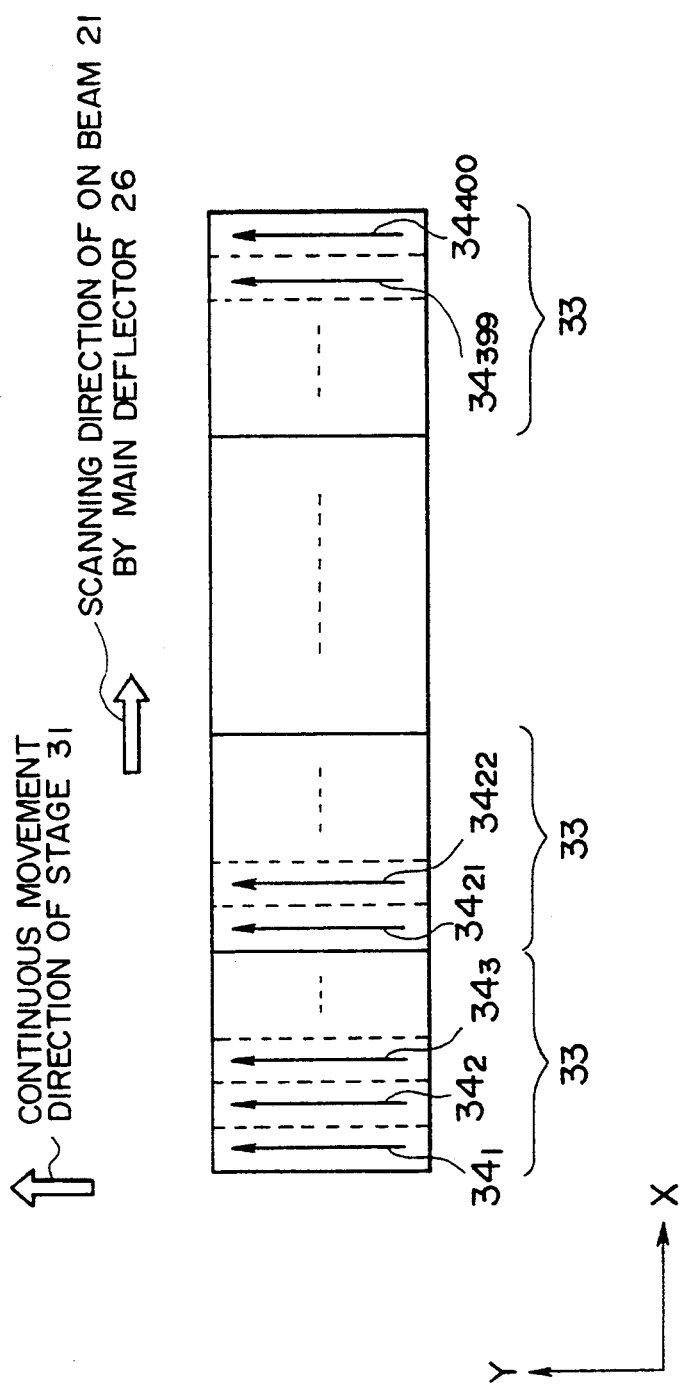
FIG. 15 is a diagram showing an ON-beam scanning direction controlled by a sub-deflector of the apparatus shown in FIG. 1, an ON-beam scanning direction controlled by a main deflector shown in FIG. 1, and a stage continuous movement direction in the case where the Y axis is selected as the priority axis according to the embodiment of the present invention.

When the priority axis is the Y axis, the magnetic field formed by the electromagnetic lens 8 is controlled so as to rotate the magnetically projected images of the BAA plate 12 in such a manner that the direction in which the columns $23_1$–$23_{16}$ extend coincides with the X-axis direction, as shown in FIG. 14. In this state, as is also shown in FIG. 15, the exposure process is performed with parameters as follows:

D2: Y axis, D3: X axis, D4: Y axis where D2 (which coincides with Y-axis direction) coincides with directions indicated by arrows $34_1$–$34_{300}$. The scanning of the ON beam 21, controlled by the sub-deflector 27, is carried out in the order of arrows $34_1$, $34_2$, ..., $34_{400}$.

Figure 17:
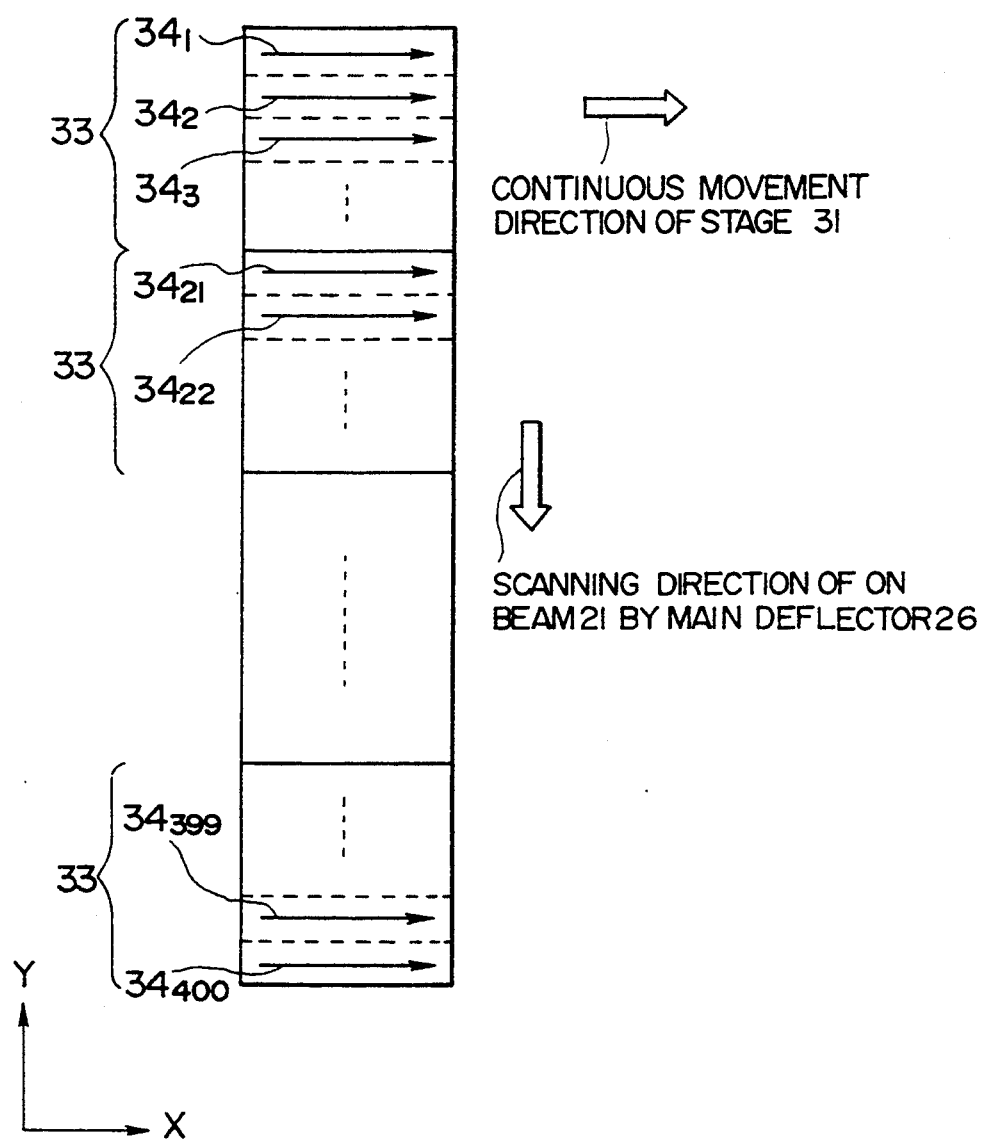
FIG. 17 is a diagram showing the ON-beam scanning direction controlled by the sub-deflector, the ON-beam scanning direction controlled by the main deflector, and the stage continuous movement direction in the case where the X axis is selected as the priority axis according to the embodiment of the present invention.

When the priority axis is the X axis, the magnetic field formed by the electromagnetic lens 8 is controlled so as to rotate the magnetically projected images of the BAA plate in such a manner that the direction in which the columns $23_1$–$23_{16}$ extend coincides with the Y-axis direction, as shown in FIG. 16. In this state, as is also shown in FIG. 17, the exposure process is performed with parameters, as follow:

D2: X axis, D3: Y axis, D4: X axis where D2 (which coincides with X-axis direction) coincides with directions indicated by arrows $34_1$–$34_{100}$. The scanning of the ON beam 21, controlled by the sub-deflector 27, is carried out in the order of arrows $34_1$, $34_2$, ..., $34_{400}$.

According to the above-mentioned embodiment of the present invention, the exposure is carried out by determining, for each layer, the scanning direction of the ON beam 21 by means of the sub-deflector 27 and the continuous movement direction of the stage 31 so that these directions coincide with the priority axis. Hence, pattern edges extending in the priority-axis direction can be more precisely formed than those extending in the non-priority-axis direction. Hence, the problem shown in FIG. 11 can be eliminated, and patterns can be precisely joined together. In the production of LSIs, the direction in which pattern edges, required to be precisely formed, extend is determined as the priority-axis direction.

Further, the above-mentioned embodiment of the present invention has the following additional advantage. The scanning of the ON beam by means of the main deflector 26 and the sub-deflector 27 as well as the continuous movement of the stage 31 in the X axis direction are equivalent to those in the Y axis direction. Hence, by changing the scanning direction by the ON beam 21 by means of the main deflector 26 and the sub-deflector 27 as well as the continuous movement direction of the stage 31, it becomes possible to diagnose faults occurring in the main deflector 26, the sub-deflector 27 and the stage 31.

Further, according to the embodiment of the present invention, it is possible to investigate the exposure characteristics using identical pattern data so that only the priority axis is changed and to hence investigate the overall apparatus and analyze faults occurring therein.

In the aforementioned embodiment of the present invention, the continuous movement direction of the stage 31 is made to coincide with the priority-axis direction. Alternatively, it is possible for the continuous movement direction of the stage 31 to coincide with the non-priority-axis direction if the high precision of joining patterns together is not strongly required.

The present invention is not limited to the specifically disclosed embodiments, and variations and modifications may be made without departing from the scope of the present invention.

What is claimed is:

1. A charged-particle beam exposure method using a charged-particle beam exposure apparatus equipped with a blanking aperture array plate in which columns are arranged side by side in a first direction, and each of the columns includes a plurality of blanking apertures arranged in a second direction substantially perpendicular to the first direction, a charged-particle beam being moved on a wafer in the first direction, said charged-particle beam exposure method comprising the steps of:
   (a) determining one of first and second axes of a pattern to be exposed to be a priority axis;
   (b) projecting an image of the blanking aperture array plate onto the wafer so that the priority axis is perpendicular to the second direction; and
   (c) deflecting the charged-particle beam so that the wafer is scanned in a direction of the priority axis.

2. The charged-particle beam exposure method as claimed in claim 1, wherein said step (b) comprises the step of controlling a magnetic field generated by an electromagnetic lens provided on a downstream side of the blanking aperture array.

3. The charged-particle beam exposure method as claimed in claim 1, wherein said step (c) comprises the step of controlling a sub-deflector.

4. The charged-particle beam exposure method as claimed in claim 1, wherein said step (c) further comprises moving the stage in the direction of the priority axis.

5. The charged-particle beam exposure method as claimed in claim 1, wherein said step (a) comprises the step of determining, for each layer to be formed on the wafer, the priority axis.

6. The charged-particle beam exposure method as claimed in claim 1 wherein:

said step (b) further comprises controlling a magnetic field, generated by an electromagnetic lens provided on a downstream side of the blanking aperture array; and said step (c) further comprises moving the stage in the direction of the priority axis.

7. The charged-particle beam exposure method as claimed in claim 1, wherein said step (a) further comprises determining the priority axis so that selected edges of the pattern, required to be more finely formed than other edges of the pattern, extend in the direction of the priority axis.

* * * * *

UNITED STATES PATENT AND TRADEMARK OFFICE
CERTIFICATE OF CORRECTION

PATENT NO. : 5,399,872
DATED : March 21, 1995
INVENTOR(S) : YASUDA et al.

It is certified that error appears in the above-indentified patent and that said Letters Patent is hereby corrected as shown below:

Col. 1, line 28, change "processor" to --precision--.

Col. 2, line 38, change "0N" to --ON--.

Col. 3, line 19, delete "includes";
line 57, after "$23_{16}$" insert --, each--; and after "of" delete "each".

Col. 4, line 24, change "0N" to --ON--;
line 44, change "ON beam" to --ON-beam--;
line 65, change "0.05" to --0.05--.

Col. 5, line 5, change "On" to --ON--;
line 7, change "wafer 20" to --wafer 30--;
line 54, change "0N" to --ON--.

Col. 7, line 25, change "231-2316" to --$23_1$-$23_{16}$--;
line 41, change "$34_{300}$" to --$34_{400}$--.

Signed and Sealed this

Seventeenth Day of October, 1995

BRUCE LEHMAN

Attest:

Attesting Officer

Commissioner of Patents and Trademarks